(12) United States Patent
Tinnemans

(10) Patent No.: US 7,508,220 B2
(45) Date of Patent: Mar. 24, 2009

(54) DETECTION ASSEMBLY AND LITHOGRAPHIC PROJECTION APPARATUS PROVIDED WITH SUCH A DETECTION ASSEMBLY

(75) Inventor: Patricius Aloysius Jacobus Tinnemans, Hapert (NL)

(73) Assignee: ASML Netherlands B.V., Veldhoven (NL)

( * ) Notice: Subject to any disclaimer, the term of this patent is extended or adjusted under 35 U.S.C. 154(b) by 680 days.

(21) Appl. No.: 10/756,749

(22) Filed: Jan. 14, 2004

(65) Prior Publication Data

US 2004/0191935 A1    Sep. 30, 2004

(30) Foreign Application Priority Data

Jan. 15, 2003    (EP) .................................. 03075128

(51) Int. Cl.
 *G01R 27/26* (2006.01)
(52) U.S. Cl. ................... 324/658; 324/686; 324/663
(58) Field of Classification Search ............. 324/658, 324/686
See application file for complete search history.

(56) References Cited

U.S. PATENT DOCUMENTS

| 4,654,581 | A |   | 3/1987 | Neukermans et al. |
|-----------|---|---|--------|-------------------|
| 4,870,452 | A | * | 9/1989 | Tanimoto et al. ............. 355/53 |
| 5,103,367 | A |   | 4/1992 | Horwitz et al. |
| 5,229,872 | A |   | 7/1993 | Mumola |
| 5,296,891 | A |   | 3/1994 | Vogt et al. |
| 5,315,259 | A | * | 5/1994 | Jostlein ..................... 324/690 |
| 5,321,363 | A | * | 6/1994 | Wakamatsu et al. ......... 324/523 |

(Continued)

FOREIGN PATENT DOCUMENTS

EP    0 984 329 A2    3/2000

(Continued)

OTHER PUBLICATIONS

Patent Abstracts of Japan, vol. 16, No. 230, May 27, 1992 and JP 04 044308 A, Feb. 14, 1992.

(Continued)

*Primary Examiner*—Diego Gutierrez
*Assistant Examiner*—John Zhu
(74) *Attorney, Agent, or Firm*—Sterne, Kessler, Goldstein & Fox P.L.L.C.

(57) ABSTRACT

An assembly for capacitively detecting an object on a support structure includes at least one electrode being arranged in the vicinity of the support structure, and at least one cable being connected to the at least one electrode. The at least one cable has a first conductor and a second conductor. The first conductor is connected to a series connection of a DC source and a first AC source. A control device is arranged to control the DC source to provide a predetermined DC voltage to the at least one electrode to provide a clamping force on the object, and control the first AC source to provide a predetermined first AC voltage with a first amplitude and a first phase via the first conductor to the at least one electrode for capacitively detecting the object. The assembly includes a second AC source connected to the second conductor and the control device is arranged to control the second AC source to provide a predetermined second AC voltage to the second conductor. The second AC voltage has a second amplitude and a second phase, respectively, which are substantially equal to the first amplitude and first phase, respectively.

15 Claims, 2 Drawing Sheets

U.S. PATENT DOCUMENTS

| | | | |
|---|---|---|---|
| 5,444,597 A * | 8/1995 | Blake et al. | 361/234 |
| 5,489,888 A | 2/1996 | Jagiella et al. | |
| 5,523,193 A | 6/1996 | Nelson | |
| 5,557,215 A * | 9/1996 | Saeki et al. | 324/765 |
| 5,670,066 A * | 9/1997 | Barnes et al. | 219/121.58 |
| 5,969,441 A | 10/1999 | Loopstra et al. | |
| 6,046,792 A | 4/2000 | Van Der Werf et al. | |
| 6,075,375 A * | 6/2000 | Burkhart et al. | 324/758 |
| 2002/0008954 A1 * | 1/2002 | Leeser | 361/234 |
| 2003/0072122 A1 * | 4/2003 | Ishida | 361/234 |

FOREIGN PATENT DOCUMENTS

| | | |
|---|---|---|
| EP | 0 984 329 A3 | 5/2002 |
| JP | 04-216650 | 8/1992 |
| JP | 09-280806 | 10/1997 |
| JP | 2001-358055 | 12/2001 |
| JP | 2002-289514 | 10/2002 |
| WO | WO 98/33096 A1 | 7/1998 |
| WO | WO 98/38597 A2 | 9/1998 |
| WO | WO 98/38597 A3 | 9/1998 |
| WO | WO 98/40791 A1 | 9/1998 |

OTHER PUBLICATIONS

G. Wilkening, "Nanopositionierungen—die Basis der Nanometrologie", *Technisches Messen* 67:298-305 (2000).

Danish Patent and Trademark Office Search Report, (Sep. 13, 2005).

Japanese Office Action issued for Japanese Patent Application No. 2004-007053, dated Aug. 1, 2007.

* cited by examiner

DETECTION ASSEMBLY AND LITHOGRAPHIC PROJECTION APPARATUS PROVIDED WITH SUCH A DETECTION ASSEMBLY

The present application claims priority to European Application No. 03075128.3, filed on Jan. 15, 2003, the entirety of which is hereby incorporated into the present application by reference thereto.

BACKGROUND OF THE INVENTION

1. Field of the Invention

The invention relates to detecting an object on a support structure.

2. Brief Description of Related Art

Detection assemblies are particularly advantageously provided in a lithographic projection apparatus. Aspects of the present invention shall therefore hereinafter be illustrated by a lithographic apparatus by way of example only. In a lithographic projection apparatus, the presence of an object on a support structure is currently detected by measuring the capacitance of an assembly comprising at least cables connected to the support structure and the support structure itself. It is impossible to measure the capacitance of the support structure only, because the measurement of the capacitance of the support structure is carried out via the cables and is thus influenced by the cables and possibly by the presence of other components in electrical contact with the support structure. The cables, in particular, introduce a relatively high additional capacitance in this measurement. The cables are, however, needed to energize electrodes which are used to exert a suitable electrostatic clamping force on the object. The presence of additional capacitances makes it difficult to establish accurately the relatively small capacitance of the support structure which furthermore varies in accordance with the position of the object. It is advantageous to be able to measure the capacitance of the support structure accurately, among others, for the following reasons. This capacitance: (1) indicates whether the object has been correctly placed and/or clamped on the support structure, (2) gives, after calculation via the formula below, the maximum force which may be exerted on the object without the object becoming detached from the support structure, and (3) enables to establish with a high degree of reliability the presence or absence of an object on the support structure without the need of an additional calibration.

Clearly, it is presently impossible to measure accurately the relatively small variable capacitance of the support structure in a lithographic projection apparatus.

SUMMARY

An aspect of the present invention is to measure the capacitance of the support structure more accurately.

According to an aspect of the invention, a lithographic apparatus is provided with an assembly for capacitively detecting an object on a support structure comprising at least one electrode being arranged in the vicinity of the support structure, and at least one cable, said at least one cable having a first conductor and a second conductor, said first conductor at a first end being connected to the at least one electrode and at a second end being connected to a first AC source, and a control device being arranged to control said first AC source to provide a predetermined first AC voltage with a first amplitude and a first phase via said first conductor to said at least one electrode for capacitively detecting said object.

According to an aspect of the present invention, one embodiment is characterized in that the assembly comprises a second AC source connected to the second conductor and the control device is arranged to control the second AC source to provide a predetermined second AC voltage to the second conductor, the second AC voltage having a second amplitude and a second phase, respectively, which are substantially equal to the first amplitude and first phase, respectively.

This allows for an accurate measurement of the capacitance of the support structure and makes it also possible to determine the change in the capacitance of the support structure with a high degree of precision, since, in the measurement, the capacitance of cables and other components that do not comprise the support structure is not measured.

In a further embodiment, an aspect of the invention is characterized in that in the first conductor a DC source is included in series with the first AC source for providing a predetermined DC voltage to the at least one electrode to provide a clamping force on the object. The clamping force ensures an appropriate bonding between the support structure and the object.

In a further embodiment, an aspect of the invention is characterized in that the first conductor of the cable is at least partially enclosed by the second conductor of the cable. The coaxial cable may have any diameter. It may also have a different geometrical shape as long as the braid (outer conductor) shields the inner conductor. Advantageously, the diameter of the conductor is chosen as small as possible to minimize the stiffness of the cable.

In a further embodiment, an aspect of the invention is characterized in that the second conductor is at least partially enclosed by a third grounded conductor. This results in a reduction of electromagnetic radiation from and to the cable.

In still a further embodiment, an aspect of the invention is characterized in that the second AC voltage is obtained from the first AC voltage with the use of an amplifier circuit with an amplification of unity. This will result in that a second AC voltage that is uncoupled from the first AC voltage, though having substantially the same amplitude and phase as the first AC voltage.

An aspect of the invention also relates to a lithographic apparatus comprising the detection assembly as described above. In a further embodiment of the invention the lithographic projection apparatus further comprises an actuator for moving the support structure, the actuator being connected to the control device, the control device being arranged to control the actuator to move the support structure after establishing that the clamping force is above a predetermined value. This means that the actuator/transport device (e.g. a robot) will carry out a movement only with a certain minimum clamping force present on the object. It may be advantageous to provide the control device with a table with information about typical movements and suitable clamping forces for the respective movements.

In still a further embodiment, an aspect of the invention is characterized in that the lithographic projection apparatus further comprises an actuator for moving the support structure, which actuator is connected to the control device, the control device being arranged to determine the clamping force on the object and to provide the actuator with a maximum value for the acceleration on the object, accordingly. In this way it is prevented that an object detaches itself from the support structure due to too high an acceleration on the object. Again, it may be advantageous to provide the control device with a table with information about typical clamping forces and respective allowable accelerations for typical transportation movements.

Aspects of the invention as described in connection with the embodiments above can also be used to determine the maximum value for the acceleration on a warped wafer put on the wafer table or on wafer put on the wafer table with a slight tilt.

An aspect of the invention also relates to a method for capacitively detecting an object on a support structure comprising: controlling a DC source to provide a predetermined DC voltage to at least one electrode to provide a clamping force on an object; controlling an AC source to provide a predetermined first AC voltage with a first amplitude and a first phase via a first conductor to the at least one electrode for capacitively detecting the object; and controlling a second AC source to provide a predetermined second AC voltage to a second conductor, the second AC voltage having a second amplitude and a second phase, respectively, which are substantially equal to the first amplitude and first phase, respectively.

An aspect of the invention further relates to a method used to calibrate the detection assembly as described above, or the lithographic projection apparatus as described above, characterized in that the method comprises: determining at least one of a first capacitance of the support structure with the object present on the support structure and a second capacitance of the support structure without the object present on the support structure, and storing at least one of the determined first capacitance and the determined second capacitance in a memory.

An aspect of the invention further relates to a method as described above to establish whether or not a support structure and an object may be moved together, characterized in that the method comprises the steps of: determining the clamping force of the support structure on the object by determining the difference in capacitance between the support structure with the object present on the support structure and the support structure without the object present on the support structure, comparing the clamping force to a predetermined minimum clamping force suitable to hold the object on the support structure during the movement; and either making the movement when the determined clamping force is more than the minimum clamping force, or refraining from making the movement when the determined clamping force is less than the minimum clamping force.

An aspect of the invention further relates to a method as described above used to keep the acceleration of the support structure and the object during a movement below, a predetermined value, characterized in that the method comprises the steps of: determining the clamping force of the support structure on the object by determining the difference in capacitance between the support structure with the object present on the support structure and the support structure without the object present on the support structure, and carrying out the movement with an acceleration less than the maximum acceleration.

An aspect of the invention further relates to a computer program product comprising instructions and data to allow an assembly to perform any of the methods as above previously.

An aspect of the invention further relates to a computer-readable medium encoded with a computer program product for use in detecting an object on a support structure, the computer program product comprising: means for controlling a DC source to provide a predetermined DC voltage to at least one electrode to provide a clamping force on an object; means for controlling an AC source to provide a predetermined first AC voltage with a first amplitude and a first phase via a first conductor to the at least one electrode for capacitively detecting the object; and means for controlling a second AC source to provide a predetermined second AC voltage to a second conductor, the second AC voltage having a second amplitude and a second phase, respectively, which are substantially equal to the first amplitude and first phase, respectively.

An aspect of the invention further relates to a computer-readable medium encoded with a program, the program comprising: controlling a DC source to provide a predetermined DC voltage to at least one electrode to provide a clamping force on an object; controlling an AC source to provide a predetermined first AC voltage with a first amplitude and a first phase via a first conductor to the at least one electrode for capacitively detecting the object; and controlling a second AC source to provide a predetermined second AC voltage to a second conductor, the second AC voltage having a second amplitude and a second phase, respectively, which are substantially equal to the first amplitude and first phase, respectively.

An aspect of the invention also relates to a detection assembly, comprising: an object; a support structure; means for capacitively detecting the object on the support structure.

An aspect of the invention also relates to a method for capacitively detecting an object on a support structure comprising: providing a predetermined DC voltage to at least one electrode to provide a clamping force on an object; providing a predetermined first AC voltage with a first amplitude and a first phase via a first conductor to the at least one electrode for capacitively detecting the object; and providing a predetermined second AC voltage to a second conductor, the second AC voltage having a second amplitude and a second phase, respectively, which are substantially equal to the first amplitude and first phase, respectively.

The term "patterning device" or "patterning structure" should be broadly interpreted as referring to a device or structure that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning devices include: (1) a mask, the concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired; (2) a programmable mirror array, one example of such a device is a matrix-addressable surface having a visco-elastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuation device. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The suitable matrix addressing can be performed using suitable electronic devices. In both of the situations described hereabove, the patterning device can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096, which are incorporated herein by reference. In the case of a programmable mirror array, the support structure may be embodied as a frame or table, for example, which may be fixed or movable; and (3) a programmable LCD array, an example of such a construction is given in U.S. Pat. No. 5,229,872, which is incorporated herein by reference. As above, the support structure in this case may be embodied as a frame or table, for example, which may be fixed or movable.

For purposes of simplicity, the rest of this text may, at certain locations, specifically direct itself to examples involving a mask and mask table; however, the general principles discussed in such instances may be seen in the broader context of the patterning device as hereabove set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper or step-and-repeat apparatus. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally<1), the speed V at which the substrate table is scanned will be a factor M times that at which the mask table is scanned. More information with regard to lithographic devices as here described can be gleaned, for example, from U.S. Pat. No. 6,046,792, incorporated herein by reference.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are provided, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4, incorporated herein by reference.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791, both incorporated herein by reference.

Although specific reference may be made in this text to the use of the apparatus according to an embodiment of the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5-20 nm), as well as particle beams, such as ion beams or electron beams.

BRIEF DESCRIPTION OF THE DRAWINGS

Aspects of the invention will now be explained in connection with the accompanying drawings, which are only intended to show examples and not to limit the scope of protection, and in which.

DETAILED DESCRIPTION OF ILLUSTRATED EMBODIMENTS

Figure 1:
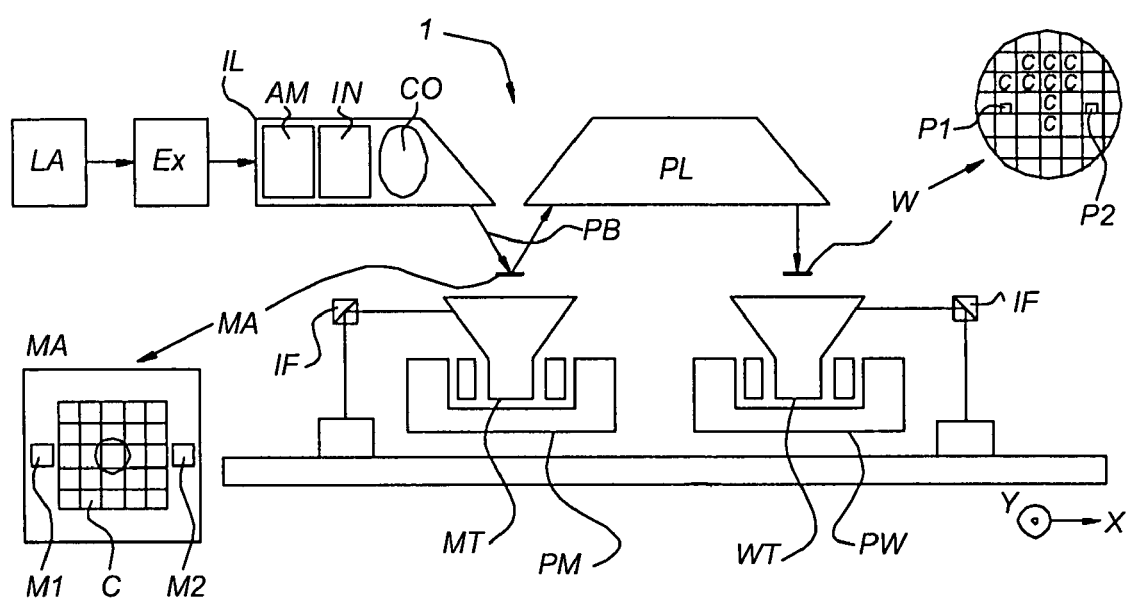
FIG. 1 is a schematic general overview of a lithographic projection apparatus in accordance with an embodiment of the invention.

FIG. 1 schematically depicts a lithographic projection apparatus 1 according to an embodiment of the invention. The apparatus comprises: a radiation system Ex, IL, for supplying a projection beam PB of radiation (e.g. EUV radiation) with a wavelength of 11-14 nm. In this particular case, the radiation system also comprises a radiation source LA; a first object table (mask table) MT provided with a mask holder for holding a patterning device, illustrated in the form of the mask MA (e.g. a reticle), and connected to first positioning structure PM for accurately positioning the mask with respect to item PL; a second object table (substrate table) WT provided with a substrate holder for holding a substrate W (e.g. a resist-coated silicon wafer), and connected to second positioning structure PW for accurately positioning the substrate with respect to item PL; and a projection system ("lens") PL for imaging an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example (with a transmissive mask). Alternatively, the apparatus may employ another kind of patterning devices, such as a programmable mirror array of a type as referred to above.

The source LA (e.g. a laser-produced plasma or a discharge plasma EUV radiation source) produces a beam of radiation. This beam is fed into an illumination system (illuminator) IL, either directly or after having a traversed conditioning structure, such as a beam expander Ex, for example. The illuminator IL may comprise an adjuster AM that sets the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning structure PW (and interferometric measuring structure IF), the substrate table WT can be moved accurately, e.g., so as to position different target portions C in the path of the beam PB. Similarly, the first positioning structure PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes.

In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB; and In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=1/4 or 1/5). In this manner, a relatively large target portion C can be exposed, without having to compromise on resolution.

Figure 2:
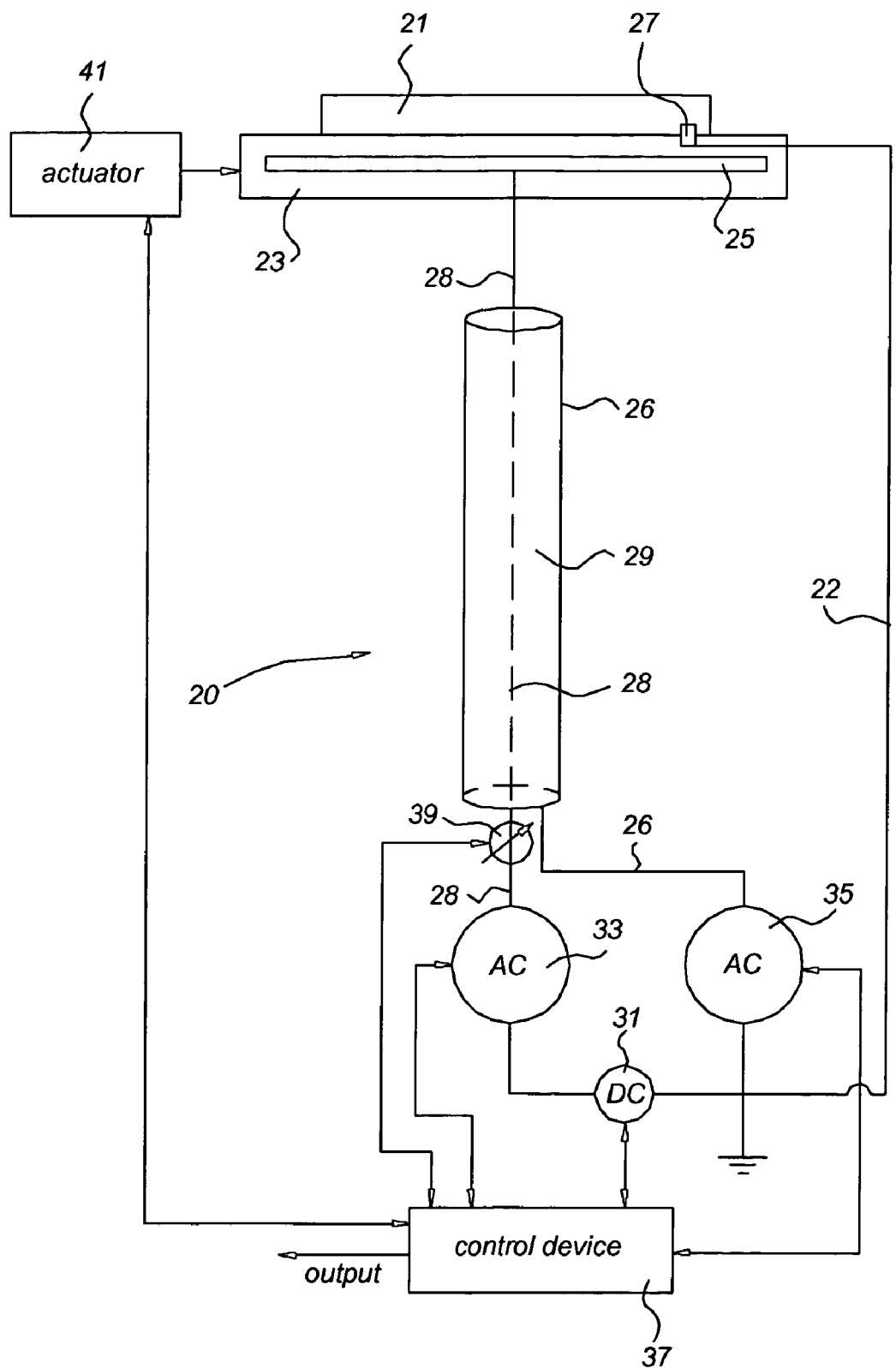
FIG. 2 shows a schematic setup of an embodiment of the invention.

In FIG. 2 an embodiment of the invention is shown. A detection assembly 20 comprises a support structure 23 (e.g. wafer table) on which an object 21 (e.g. wafer) is mounted or "clamped". The support structure 23 comprises a first electrode 25. The electrode 25 may consist of multiple sections. For example, two halve circularly shaped "D's", which would result in a system with two identical circuits each connected to their respective electrode parts. A second (counter) electrode 27 is in electrical contact with the object 21. The first electrode 25 is connected to a conductor 28 and the second electrode to a conductor 22. As shown in FIG. 2, the conductor 28 may be an inner conductor of a coax cable 29. The outer braid of the coax cable 29 is formed by a conductor 26. It may be advantageous for the inner conductor 28 to not see its environment electrically. The cable 29 is connected to a DC voltage source 31. In series with the DC voltage source 31, an AC voltage source 33 is connected. Another AC voltage source 35 is connected to the outer conductor 26 in parallel with the DC voltage source 31. The shielding, effected by the conductor 26, and the additional AC source 35 yield the suitable result. The DC voltage source 31, the AC voltage source 33 and the AC voltage source 35 are each connected to a control unit or controller 37.

A (current) measurement unit 39 is provided, e.g., in conductor 28 to measure the current flowing in conductor 28. The current measurement unit 39 is connected to the control unit 37. The unit 39 may be connected in between the AC voltage source 33 and the cable 29 (as shown in FIG. 2) or between the cable 29 and the wafer table 23. Also, when a resonant circuit solution is chosen, the change in frequency can be measured by the measurement unit 39. An actuator 41 is provided to move the support structure as desired and as controlled by control unit 37.

The assembly 20 operates in the following way: the DC voltage source provides the electrodes 25 and 27 with a DC voltage. The DC voltage generates an electric field in between the electrodes 25 and 27. The electric field provides the attracting clamping force on the object 21 to the support structure 23. To measure the capacitance of the assembly 20 the AC voltage source 33 is used. The capacitance value is then calculated by the control unit 37, using the AC value of the AC source 33 and the current value provided by current measurement unit 39, as is known to persons skilled in the art. The capacitance value measured is larger when the object (e.g., wafer) is present than when the object is not present. Therefore, the capacitance measurement provides information as to whether or not the object is present.

However, the capacitance measurement is strongly influenced by the capacitance of the cable 29 since the latter capacitance is much larger than the capacitance difference due to whether or not object 21 is present. Therefore, the setup of FIG. 2 is arranged such that it eliminates the capacitance of the cable 29 in the measurement.

To eliminate the capacitance of the cable 29 from this measurement, the AC voltage source 35 provides an AC voltage to the outer conductor 26 which is of the same phase and has the same amplitude as the AC voltage provided by the AC voltage source 33 to the inner conductor 28. Thus the voltage difference across the two conductors 26, 28 will be zero and the cable 29 will not add to the capacitance of the assembly 20.

The assembly of FIG. 2 provides for a more accurate measurement of the capacitance contribution due to the object 21, e.g., it is envisaged that deviations from an ideal, expected capacitance value can now be measured more easily. Such deviations may, e.g., be caused by a deviation of an expected flatness of a clamped wafer.

Moreover, absolute values of the capacitance measurement now provide accurate and reliable indications whether or not the object 21 is present. Thus, when the arrangement of FIG. 2 is used in the lithography system of FIG. 1, measuring the capacitance when the system is switched on, may directly and unambiguously provide an indication whether a wafer is present. This avoids the need for a complicated calibration measurement.

In a further embodiment, the arrangement of FIG. 2 is used to calculate an electrostatic clamping pressure exerted by electrode 25 to the object 21 to clamp the latter. To that end, the capacitance is measured twice, i.e., once with the object 21 present and once without the object 21 being present. When the difference in capacitance value between these two measurements is defined to be $\Delta C$, the electrostatic clamping pressure P follows for a single electrode setup, where the capacity is measured between the electrode 25 and the wafer 21, from:

$$P = \frac{1}{2\varepsilon_0 A^2} \cdot V^2 \cdot \Delta C^2 \quad [\text{Pa}]$$

in which:
A=surface area of object 21
V=voltage of DC source 31
$\varepsilon_0$=dielectric constant of vacuum.

For a bipolar setup, where the capacity between two electrodes is measured, with the wafer electrically floating in between, the above formula changes to:

$$P = \frac{8}{\varepsilon_0 A^2} \cdot V^2 \cdot \Delta C^2 \quad [\text{Pa}]$$

in which the same symbols as above are used.

Instead of measuring the capacitance without the object 21 being present, alternatively, the capacitance could be measured with a perfectly flat surface present. This second reference measurement combined with the measurement without the object 21 being present could also make it possible to obtain a (linear) calibration graph with known offset and gain for the system.

Knowing this electrostatic clamping pressure P may be advantageous since it can be used as an indication for a maximal allowance acceleration of the object 21 as clamped. When the object is a wafer 21, the maximal allowable acceleration of the support structure 23 with the clamped wafer 21 follows from the electrostatic clamping pressure P multiplied by the friction coefficient of the wafer 21 on the support structure 23. This result, as calculated by control unit 37, may then be used by control unit 37 to control actuator 41 such that actuator 41 provides support structure 23 with an acceleration below the maximal acceleration.

On the other hand, when the control unit 37 knows a maximal acceleration to be exerted on the support structure, it may control DC source 31 to reduce the clamping voltage if control unit 37 has determined that the actual clamping force exceeds a necessary clamping force. This is advantageous, since it may, for example, help to reduce contamination.

As mentioned above, aspects of the present invention have been described by a lithographic apparatus, it is emphasized however that the description above is given by way of example only and is not meant to limit the scope of the present invention. Although the AC sources 33, 35, the DC source 37 and the control unit 37 are shown as separate units they may be implemented in any other technically equivalent way, e.g., as one single unit connected to the conductors 28, 29 but providing the same functionality. Thus, FIG. 2 shows the basic functional units but not necessarily the only way of implementation. The control unit 37 may be a computer driven by suitable software. However, analog and/or digital circuits may also be used, as desired. The AC source 35 may be controlled by the AC source 33 such that it multiplies the AC source 35 output AC voltage by unity to obtain an accurate equal AC voltages output.

What is claimed is:

1. A detection assembly to capacitively detect an object on a support structure, comprising:
at least one electrode being arranged adjacent said support structure;
at least one cable having a first conductor and a second conductor, said first conductor having a first end connected to said at least one electrode;
a first AC source connected to a second end of the first conductor;
a controller structured to control said first AC source to provide a first AC voltage with a first amplitude and a first phase via said first conductor to said at least one electrode to capacitively detect said object on said support structure;
a second AC source connected to said second conductor, wherein said controller is configured to control said second AC source to provide a second AC voltage to said second conductor, said second AC voltage having a second amplitude and a second phase, which are substantially equal to said first amplitude and said first phase, respectively; and
a DC source, wherein the DC source is in series with said first AC source to provide a DC voltage to said at least one electrode to provide a clamping force on said object.

2. A detection assembly according to claim 1, wherein said object is one of a wafer or a reticle.

3. A detection assembly according to claim 1, wherein said first conductor is at least partially enclosed by said second conductor.

4. A detection assembly according to claim 1, wherein said second AC voltage source is controlled, in use, by the first AC voltage source such that the first AC voltage source multiplies the second AC voltage by unity.

5. A lithographic apparatus, comprising:
an illumination system constructed to provide a beam of radiation; and
a detection assembly configured to capacitively detect an object on a support structure, said detection assembly including:
at least one electrode being arranged adjacent said support structure;

at least one cable having a first conductor and a second conductor, said first conductor having a first end connected to said at least one electrode;

a first AC source connected to a second end of the first conductor;

a controller structured to control said first AC source to provide a first AC voltage with a first amplitude and a first phase via said first conductor to said at least one electrode to capacitively detect said object on said support structure;

a second AC source connected to said second conductor, wherein said controller is configured to control said second AC source to provide a second AC voltage to said second conductor, said second AC voltage having a second amplitude and a second phase, which are substantially equal to said first amplitude and said first phase, respectively; and an actuator constructed to move said support structure, said actuator being connected to said controller, said controller being structured to determine a clamping force on said object and to provide said actuator with a maximum value for the acceleration on said object based on the determined clamping force.

6. A lithographic apparatus according to claim 5, wherein said controller is structured to control said actuator to move said support structure when a clamping force is above a certain value.

7. A lithographic apparatus according to claim 5, wherein said first conductor is connected to a DC source that is in series with said first AC source to provide a DC voltage to said at least one electrode to provide a clamping force on said object.

8. A lithographic apparatus according to claim 5, wherein said first conductor is at least partially enclosed by said second conductor.

9. A method for capacitively detecting an object on a support structure comprising:

controlling a DC source to provide a DC voltage to at least one electrode to provide a clamping force on an object;

controlling an AC source to provide a first AC voltage with a first amplitude and a first phase via a first conductor to the at least one electrode to capacitively detect the object;

controlling a second AC source to provide a second AC voltage to a second conductor, the second AC voltage having a second amplitude and a second phase, which are substantially equal to the first amplitude and first phase, respectively;

determining the clamping force of the support structure on the object by determining the difference in capacitance between the support structure with the object present on the support structure and the support structure without the object present on the support structure;

deriving from the clamping force a maximum acceleration of the support structure and the object during a movement which causes movement of the support structure relative to the object; and moving the support structure and the object, wherein an acceleration of the support structure and the object is less than the maximum acceleration.

10. A method according to claim 9, further comprising:

determining a first capacitance of the support structure with the object present on the support structure, or a second capacitance of the support structure without the object present on the support structure, or both the first capacitance and second capacitance; and storing the determined first capacitance and/or determined second capacitance in a memory.

11. A method according to claim 9, further comprising:

determining the clamping force of the support structure on the object by determining the difference in capacitance between the support structure with the object present on the support structure and the support structure without the object present on the support structure;

comparing the clamping force to a minimum clamping force suitable to hold the object on the support structure during movement of the support structure; and moving the support structure and the object together when the determined clamping force is more than or equal to the minimum clamping force unless the determined clamping force is less than the minimum clamping force.

12. A computer-readable medium encoded with a program, said program comprising instructions to perform a method comprising:

controlling a DC source to provide a first DC voltage to at least one electrode to provide a clamping force on an object;

controlling an AC source to provide a first AC voltage with a first amplitude and a first phase via a first conductor to the at least one electrode to capacitively detect the object, wherein said AC source is in series with said DC source;

controlling a second AC source to provide a second AC voltage to a second conductor, the second AC voltage having a second amplitude and a second phase, which are substantially equal to the first amplitude and first phase, respectively;

determining the clamping force of a support structure on the object by determining the difference in capacitance between the support structure with the object present on the support structure and the support structure without the object present on the support structure;

deriving from the clamping force a maximum acceleration of the support structure and the object during a movement which causes movement of the support structure relative to the object; and instructing to move the support structure and the object, wherein an acceleration of the support structure and the object is less than the maximum acceleration.

13. A computer readable medium according to claim 12, wherein the method further comprises:

determining a first capacitance of a support structure with the object present on a support structure, or a second capacitance of the support structure without the object present on the support structure, or both the first and second capacitance; and storing the determined first capacitance and/or determined second capacitance in a memory.

14. A computer readable medium according to claim 12, wherein the method further comprises:

determining the clamping force of a support structure on the object by determining the difference in capacitance between the support structure with the object present on the support structure and the support structure without the object present on the support structure;

comparing the clamping force to a minimum clamping force suitable to hold the object on the support structure during movement of the support structure; and instructing to move the support structure and the object together when the determined clamping force is more than or equal to the minimum clamping force unless the determined clamping force is less than the minimum clamping force.

15. A method for capacitively detecting an object on a support structure comprising:
- providing a DC voltage to at least one electrode to provide a clamping force on an object;
- providing a first AC voltage with a first amplitude and a first phase via a first conductor to the at least one electrode to capacitively detect the object;
- providing a second AC voltage to a second conductor, the second AC voltage having a second amplitude and a second phase, which are substantially equal to the first amplitude and first phase, respectively;
- determining the clamping force of the support structure on the object by determining the difference in capacitance between the support structure with the object present on the support structure and the support structure without the object present on the support structure;
- comparing the clamping force to a minimum clamping force suitable to hold the object on the support structure during movement of the support structure; and
- moving the support structure and the object together, when the determined clamping force is more than or equal to the minimum clamping force unless the determined clamping force is less than the minimum clamping force.

* * * * *